United States Patent [19]
Ajika et al.

[11] Patent Number: 5,554,867
[45] Date of Patent: Sep. 10, 1996

[54] NONVOLATILE SEMICONDUCTOR MEMORY DEVICE HAVING A MEMORY CELL TRANSISTOR AND A SELECT TRANSISTOR

[75] Inventors: Natsuo Ajika; Atsushi Ohba, both of Hyogo, Japan

[73] Assignee: Mitsubishi Denki Kabushiki Kaisha, Tokyo, Japan

[21] Appl. No.: 352,656

[22] Filed: Dec. 9, 1994

[30] Foreign Application Priority Data

Dec. 27, 1993 [JP] Japan ................................. 5-330067
Nov. 8, 1994 [JP] Japan ................................. 6-273732

[51] Int. Cl.⁶ ................................................ H07L 29/68
[52] U.S. Cl. ...................... 257/314; 257/315; 257/319; 257/316; 257/382; 257/758; 365/185.01; 365/185.05
[58] Field of Search .................................. 257/314, 315, 257/903, 319, 320, 321, 316; 365/185.01, 51, 63, 185.02, 185.03, 185.26, 185.29, 185.33, 185.05

[56] References Cited

U.S. PATENT DOCUMENTS 4,868,619  9/1989  Mukherjee et al. .................. 257/315
5,416,349  5/1995  Bergemont ........................... 257/316

FOREIGN PATENT DOCUMENTS 3-14272    1/1991  Japan .
4-208566   7/1992  Japan .
5-3326     1/1993  Japan .
5-55530    3/1993  Japan .

OTHER PUBLICATIONS

"Alternate Metal Virtual Ground EPROM Array Implemented in a 0.8 µm Process for Very High Density Applications", R. Kazerunian et al., IEDM 91, pp. 311–314.

"A Novel Cell Structure Suitable for a 3 Volt Operation, Sector Erase Flash Memory", H. Onoda et al., IEDM 92, pp. 599–602.

Primary Examiner—Rolf Hille
Assistant Examiner—David B. Hardy
Attorney, Agent, or Firm—Lowe, Price, LeBlanc & Becker

[57] ABSTRACT

A nonvolatile semiconductor memory device is provided including a DINOR (Divided Bit Line NOR) type cell that allows further reduction of the cell size while ensuring immunity from drain-disturb. In the nonvolatile semiconductor memory device, a sub-bit line is formed to have a length corresponding to the length of 16–1024 memory cell transistors. Memory cell transistors corresponding to the length of that sub-bit line are connected to the sub-bit line. Thus, the effective cell size is reduced while ensuring immunity from drain-disturb.

14 Claims, 8 Drawing Sheets

NONVOLATILE SEMICONDUCTOR MEMORY DEVICE HAVING A MEMORY CELL TRANSISTOR AND A SELECT TRANSISTOR

BACKGROUND OF THE INVENTION

1. Field of the Invention

The present invention relates to nonvolatile semiconductor memory devices, and more particularly, to a nonvolatile semiconductor memory device including a memory cell transistor and a select transistor for storing information by drawing electrons from a floating gate by means of a tunnel phenomenon.

2. Description of the Background Art

An EEPROM (Electrically Erasable and Programmable Read Only Memory) that can program data arbitrarily and that can electrically write/erase information is known as one typical type of a nonvolatile semiconductor memory device. An EEPROM is advantageous in that writing and erasing can both be carried out electrically. However, because two transistors are required in a memory cell, it was difficult to increase the integration density. A flash EEPROM is proposed that has a memory cell formed of one transistor, and that can electrically erase written information globally. Such a flash EEPROM is disclosed in, for example, U.S. Pat. No. 4,868,619.

Furthermore, a DINOR (Divided Bit Line NOR) type cell is proposed as a nonvolatile semiconductor memory device that realizes various problems for a flash memory such as low cost, low voltage and low power consumption, high speed writing, sector erasure (independent partial erasure), and high reliability. The details of such a DINOR type cell is disclosed in IEDM, 1992, pp. 599-602, for example. A DINOR type cell employs a main/sub-bit line structure in a conventional NOR type cell with a select gate.

FIG. 9 is a sectional view of a conventional proposed DINOR type cell. FIG. 10 is an equivalent circuit diagram showing the array structure of a conventional DINOR type cell. Referring to FIG. 9, 8 bits (8 cells) of memory cell transistors 110 are formed with a predetermined distance therebetween in a conventional DINOR type cell. A select transistor 103 is formed so as to be adjacent to memory cell transistor 110. A sub-bit line 102 is formed to electrically connect the 8 bits of memory cell transistors 110.

A main bit line 101 is formed connected to select transistor 103. A word line 104 is provided above main bit line 101 with a predetermined distance therebetween. A DINOR type cell of the above-described structure can achieve low voltage-low power consumption and high speed writing by modifying the electron injection mechanism to a mechanism that employs FN (Fowler-Nordheim) tunneling phenomenon. Low cost and sector erasure are realized by employing a main/sub-bit line structure and by using a select gate. The problem of drain-disturb phenomenon that occurs in the erasure operation of each sector is eliminated due to the usage of a select gate. The operation speed is as high as that of a conventional flash memory.

As shown in FIG. 10, a conventional DINOR type cell has the number of second aluminum interconnections (word lines) 104 reduced to half the number of control gates (word lines) 120 by connecting a control gate (word line) symmetrically sandwiching a select gate (or an element isolation region). Therefore, the pitch of a second aluminum interconnection (word line) 104 that has a large minimum pitch according to the limitation of a manufacturing process can be made double that of control gate 120. As a result, connection (shunt) between second aluminum interconnection 104 and control gate 120 can be implemented easily.

However, the above structure had a problem that an additional region for connecting the two symmetrically positioned control gates (word lines) 120 is required to prevent increase in the integration density. It was also difficult to further reduce the cell size in a conventional DINOR type cell having 8 memory cells connected to each bit line 102.

SUMMARY OF THE INVENTION

An object of the present invention is to provide a nonvolatile semiconductor memory device that allows further reduction of the memory size.

A further object of the present invention is to provide a nonvolatile semiconductor memory device that allows shunting between a word line and a control gate without connecting control gates (word lines) with each other.

Another object of the present invention is to improve the read-out characteristic of a memory cell while further reducing the cell size in a nonvolatile semiconductor memory device.

Still another object of the present invention is to reduce the contact resistance between a sub-bit line and a source region while further reducing the cell size in a nonvolatile semiconductor memory device.

According to an aspect of the present invention, a nonvolatile semiconductor memory device includes a memory cell transistor and a select transistor for storing information by drawing electrons from a floating gate by means of a tunnel phenomenon in a region where the drain region and the floating gate of the memory cell transistor overlap. The nonvolatile semiconductor memory device includes a main bit line and a sub-bit line. The main bit line is electrically connected to the select transistor. The sub-bit line is electrically connected to the memory cell transistor, and has a length corresponding to 16–1024 memory cell transistors. Preferably, a sub-bit line includes two lines of a first sub-bit line and a second sub-bit line with a predetermined distance therebetween in a direction perpendicular to the extending direction of the main bit line and extending parallel to the extending direction of the main bit line with respect to a predetermined length of one main bit line, and having a select transistor connected to each sub-bit line. Preferably, a word line of a first conductive layer is formed above the control gate of the memory cell transistor with a first interlayer insulation film therebetween, and a main bit line of a second conductive layer is formed on the word line with a second interlayer insulation film therebetween. Preferably, the channel width of the select transistor may be wider than the channel width of the memory cell transistor. Preferably, the connection between the sub-bit line and the source region of the select transistor may be implemented via a plurality of contact holes.

Because the nonvolatile semiconductor memory device has the sub-bit line formed with a length corresponding to 16–1024 memory cell transistors, immunity from drain-disturb is ensured while the effective cell size can be reduced. By providing two sub-bit lines with respect to a predetermined length of one main bit line, and connecting one select transistor to each one sub-bit line, the pitch of the main bit line can be doubled that of the sub-bit line. By providing a word line of a first conductive layer above the control gate of a memory transistor with a first interlayer insulation film therebetween, and providing a main bit line of a second conductive layer above the word line with a second interlayer insulation film therebetween, connection between a word line and a control gate (word line shunting) can be achieved by means of the first conductive layer having a minimum pitch smaller than that of the second conductive layer. As a result, connection (shunting) between a word line and a control gate can be achieved without connecting control gates with each other. By forming the channel width of the select channel greater than that of the memory cell transistor, the current in a reading operation can be increased to reduce the operation time for reading. By carrying out connection between the sub-bit line and the source region of the select transistor via a plurality of contact holes, the contact resistance between the sub-bit line and the source region of the select transistor can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

It is known that the factors preventing cell size reduction in a DINOR type cell are the isolation region between the select gate and the block with respect to the extending direction of a bit line, and the minimum pitch of the first aluminum interconnection forming the main bit line with respect to the extending direction of a word line.

There are three factors that define the number of select gates, that is to say, the erasure block size, drain-disturb, and the effective cell size.

In general, the product of the number of cells connected to one select gate (the number of cells connected to one sub-bit line) and the word line length determine the erasure block (sector) size. In a conventional DINOR type cell shown in FIGS. 9 and 10, a select gate is provided for every 8 bits (the sub-bit line length is 8 bits (8 cells)). A combination thereof forms 1 block. Here, the erasure block (sector) size is 16×512=1K bytes since the word line length is 512 bits.

The problem of drain-disturb is set forth in the following. A drain-disturb is referred to an erroneous writing that occurs due to the voltage applied to the drain at the time of writing being also applied to a de-select cell on the same bit line. A DINOR type cell takes advantage of a FN tunneling phenomenon in both writing and erasing operations. In a writing operation, electrons are drawn out from the floating gate by means of a tunnel phenomenon in the region where the drain overlaps with the floating gate of the memory cell transistor to carry out writing. Erasure is carried out by injecting electrons into the floating gate by means of FN tunneling. The time in which disturb is encountered with a cell is proportional to the number of cells connected to the same sub-bit line. Therefore, if the length of a sub-bit line is to be increased, the drain-disturb immunity must also be improved.

The effective cell size per 1 bit is A+S/n where the area of a select gate region is S, the number of cells connected to one select gate is n, and the cell size per bit is A. It can be said that the length of the sub-bit line should be increased for a larger number of cells n in order to reduce the effective cell area.

Figure 1:
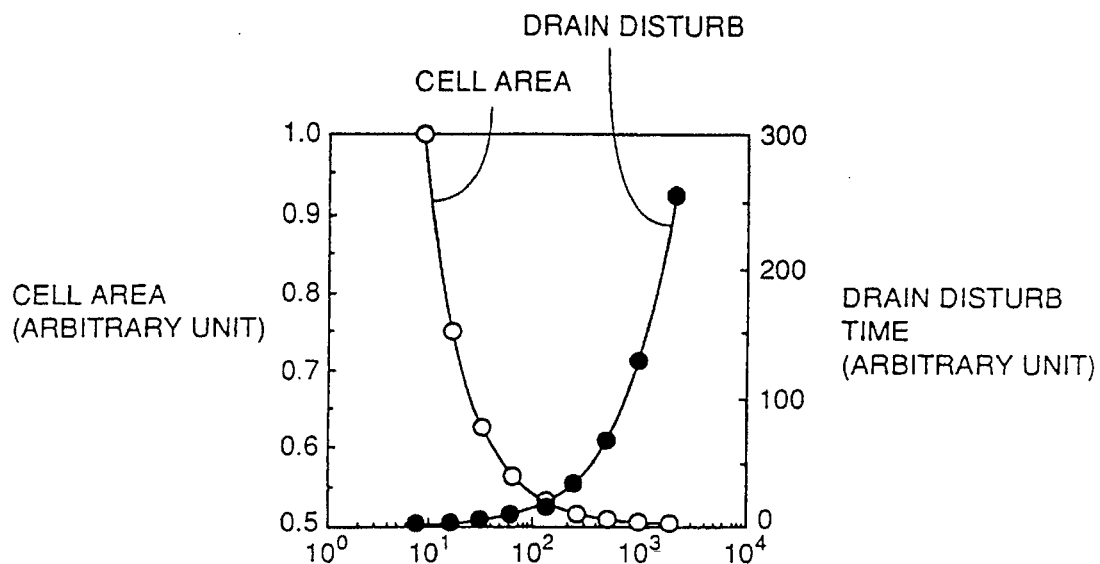
FIG. 1 is a diagram for describing the concept of a DINOR type cell according to a first embodiment of the present invention.

The concept of a DINOR type cell of a first embodiment will be described hereinafter with reference to FIG. 1. Reduction of the effective cell area by increasing the sub-bit line length to increase the number of cells is possible only to a certain degree (to 1024 cells) due to its saturation. It is known that drain-disturb increases in proportion to the sub-bit line length (the number of cells n connected to one select gate). On the basis of these two characteristics, it is appreciated that an appropriate length of a sub-bit line is approximately that corresponding to 16–1024 cells in the present embodiment. In the first embodiment, the drain-disturb immunity is ensured while allowing reduction of the effective cell size by setting the length of a sub-bit line to approximately 16–1024 cells. The above is a consideration on cell area reduction in the bit line direction.

The word line extending direction will also be considered in the following. The size of a flash memory in the word line direction depends upon the width of the element isolation area and the interconnection pitch of the bit lines. In a general NOR cell, the threshold value of a parasitic MOS transistor of an isolation region must be not less than 12 V since a high voltage (~12 V) is applied to the word line at the time of writing. Therefore, a thick isolation oxide film and a certain isolation interval is required. In a DINOR type cell, a high voltage (~10 V) is applied to a word line only at the time of erasure. It is not necessary to isolate the cells from each other in principle since erasure is carried out by each block. This means that the limitation due to isolation is hardly not a problem in a DINOR type cell in comparison with that of a NOR type cell. As to the interconnection pitch of bit lines, both a NOR type cell and a conventional DINOR type cell have a bit line formed of a first aluminum interconnection. Therefore, they will be subjected to the same limitation as long as the layout is carried out by the same design rules. In view of the foregoing, the following structure is provided.

Figure 2:
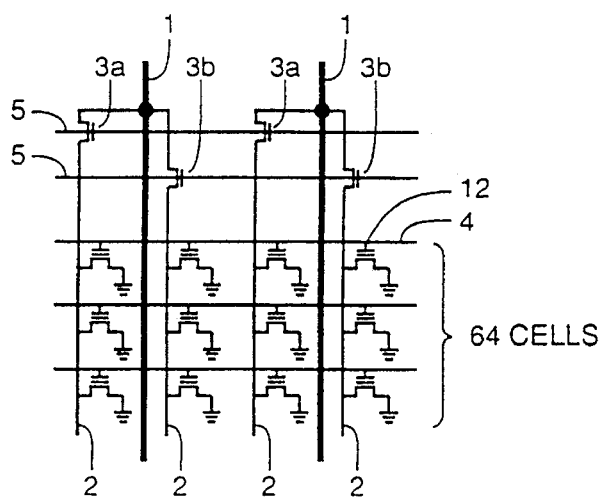
FIG. 2 is an equivalent circuit diagram showing a DINOR type cell according to a second embodiment of the present invention.
Figure 3:
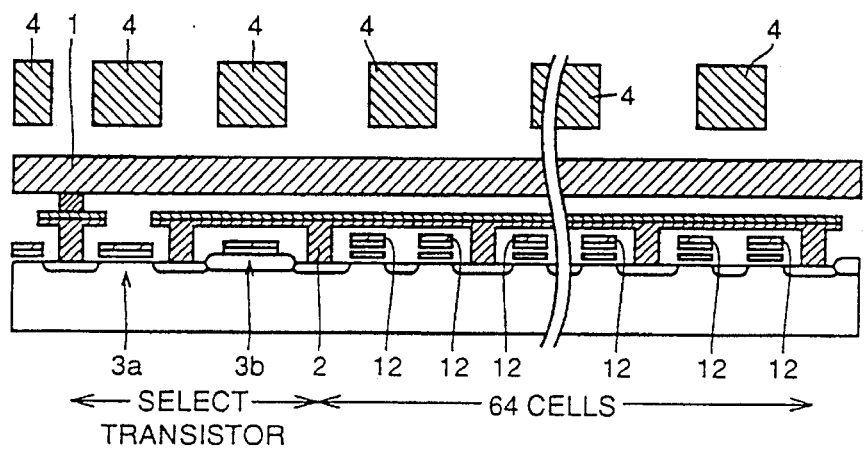
FIG. 3 is a sectional view of the DINOR type cell of FIG. 2.

Referring to a second embodiment shown in FIGS. 2 and 3, two sub-bit lines 2 are connected with respect to a predetermined length of one main bit line 1. Select transistors 3a and 3b are connected to two sub-bit lines 2, respectively. This allows the pitch of an aluminum interconnection (main bit line 1) to be doubled. Sub-bit line 2 employs a polysilicon interconnection, a polycide interconnection, or an interconnection of refractory metal such as tungsten that allows a smaller layout in comparison with the aluminum interconnection pitch. Sub-bit line 2 is formed to extend substantially parallel to main bit line 1 and perpendicular to word line 4. A source line 5 is formed to extend substantially parallel to word line 4. Main bit line 1 is actually formed in a further extending manner, wherein two sub-bit lines 2 are connected corresponding to a predetermined length thereof. More specifically, two sub-bit lines are connected for every predetermined length of main bit line 1. A plurality of pairs of sub-bit lines 2 are connected with a predetermined distance therebetween in the extending direction of main bit line 1 with respect to an entire main bit line.

Although the area occupied by the select gate region is increased by providing the select gate in two stages, the effective area loss can be reduced by increasing the length of the sub-bit line (64 cells in the second embodiment). The effective cell area of a conventional DINOR type cell is 1.8 µm (word line direction)×1.6 µm (bit line direction)=2.88 µm². In the DINOR type cell of the second embodiment, the effective cell area is 1.4 µm (word line direction)×1.3 µm (bit line direction)=1.82 µm , resulting in a reduction of 63% in area.

A third embodiment of the present invention will be described hereinafter. In prior art and in the second embodiment, symmetrically positioned control gates (word lines) sandwiching a select gate are connected to each other since direct shunting cannot be obtained with the second aluminum interconnection due to the small pitch of the control gate (word line). The pitch of the shunting second aluminum interconnection is doubled. It is therefore possible to reduce the pitch of the control gates (word lines) independent of the layout limitation of the second aluminum interconnection where only a large great pitch is allowed.

Such a structure requires the provision of an additional region for connecting the symmetrically positioned control gates (word lines). The area of this region is proportional to the number of control gates (word lines) to be connected, i.e. the sub-bit line length, and is inversely proportional to the interval of the shunting word line. It is therefore necessary to consider the consequence of this region in taking account of the effective cell area.

Figure 4:
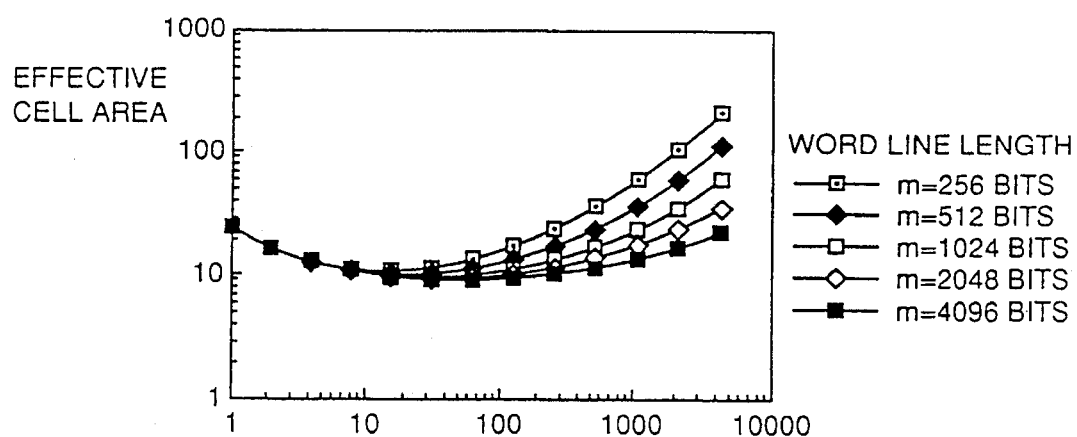
FIG. 4 is a graph showing the relationship between an effective cell area and a sub-bit line length in a structure where two symmetrically positioned word lines are connected to each other.

FIG. 4 shows the relationship between the effective cell area and the sub-bit line length on the basis of the additional area. It is appreciated from FIG. 4 that the effective cell area will become so great that area loss cannot be neglected if the length of a sub-bit line is restricted to be a length corresponding to approximately 16–32 cells in implementing shunting for every 256 bits in order to reduce the resistance of the control gate (word line).

Figure 5:
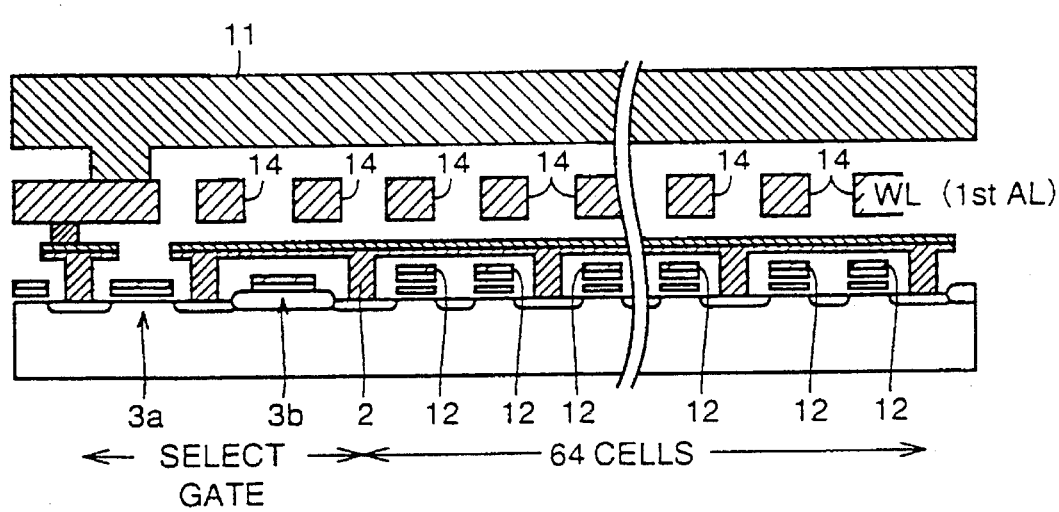
FIG. 5 is a sectional view of a DINOR type cell according to a third embodiment of the present invention.
Figure 6:
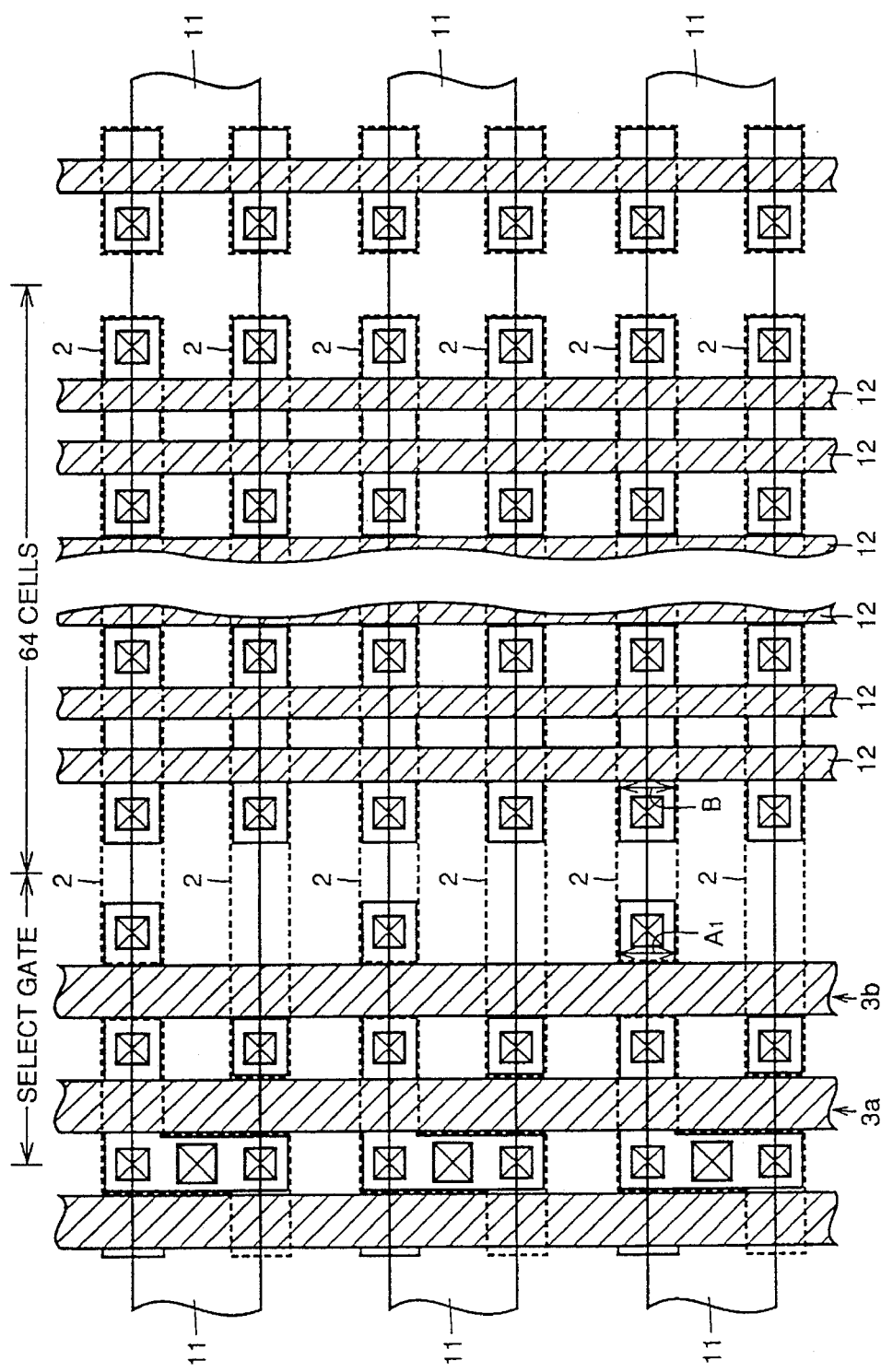
FIG. 6 is a plan view of the DINOR type cell of FIG. 5.

A third embodiment is provided to solve such a disadvantage. In the third embodiment shown in FIG. 5, main bit line 11 conventionally formed of a first aluminum interconnection is substituted with a second aluminum interconnection, and shunting of control gate (word line) 12 is achieved, not by second aluminum interconnection, but by first aluminum interconnection 14. The minimum pitch of first aluminum interconnection 14 is generally smaller than that of second aluminum interconnection 11. Therefore, first aluminum interconnection 14 can be made identical to control gate (word line) 12 in pitch. In the third embodiment, the channel width B of the active region of a memory cell is set to be identical to the channel width $A_1$ of select transistors 3a and 3b, as shown in FIG. 6.

By the above-described structure, control gate 12 can be shunted by word line 14 without having to connect control gates 12 with each other. Here, the required pitch of main bit line 11 is made two times that of a sub-bit line by forming the select gate in a two stage manner as in the second embodiment. Therefore, there is no problem in arranging main bit line 11 by second aluminum interconnection 11. By such a structure, the effective cell size can further be reduced in the third embodiment because the region for connecting control gates (word lines) 12 with each other is not required.

Figure 7:
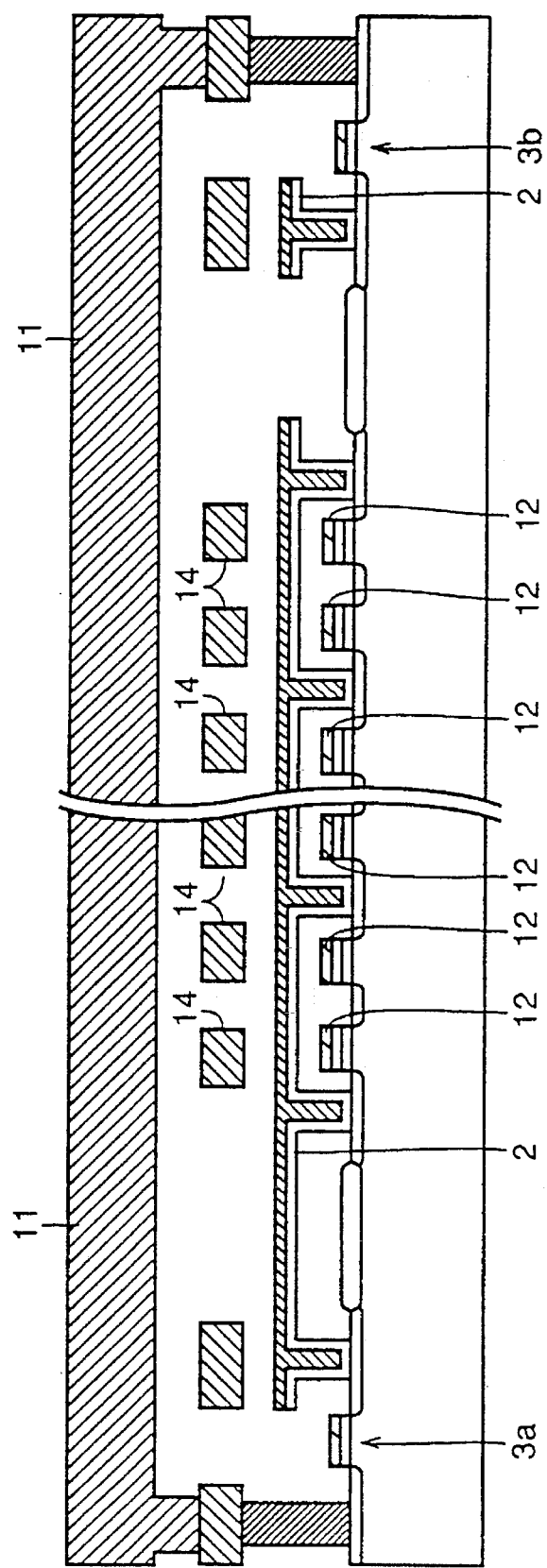
FIG. 7 is a sectional view of a DINOR type cell according to a fourth embodiment of the present invention.
Figure 8:
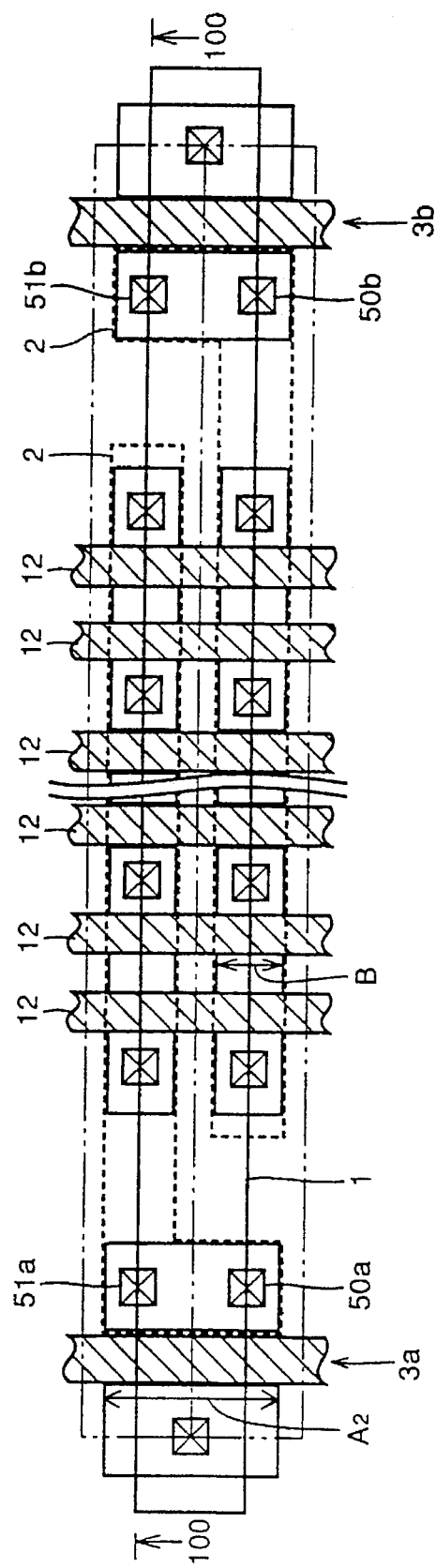
FIG. 8 is a plan view of the DINOR type cell of FIG. 7.

A fourth embodiment of the present invention will be described with reference to FIGS. 7 and 8. FIG. 7 is a sectional view taken along lines 100–100 of FIG. 8. The fourth embodiment differs from the above-described second and third embodiments in that select transistors 3a and 3b are provided at either sides of sub-bit line 2.

In the fourth embodiment, the channel width $A_2$ of select transistors 3a and 3b is formed to be greater than channel width B of a memory cell transistor. More specifically, channel width $A_2$ of select transistors 3a and 3b is set to be at least 3 times the channel width B of the memory cell transistor. This structure allows reduction in the ON resistance of select transistors 3a and 3b, resulting in increase in the cell current at the time of reading. Therefore, the read out operation rate can be improved.

In the fourth embodiment, the width of the source region of select transistors 3a and 3b is formed to be identical to channel width $A_2$. Therefore, the source region of select transistors 3a and 3b connected to sub-bit line 2 can have a sufficient width. As a result, sub-bit line 2 and the source regions of select transistors 3a and 3b can be connected via a plurality of contact holes. In the present embodiment, the source regions and sub-bit line 2 are connected via two contact holes. This structure provides the advantage that the contact resistance of sub-bit line 2 and the source regions of select transistors 3a and 3b can be further reduced.

Figure 9:
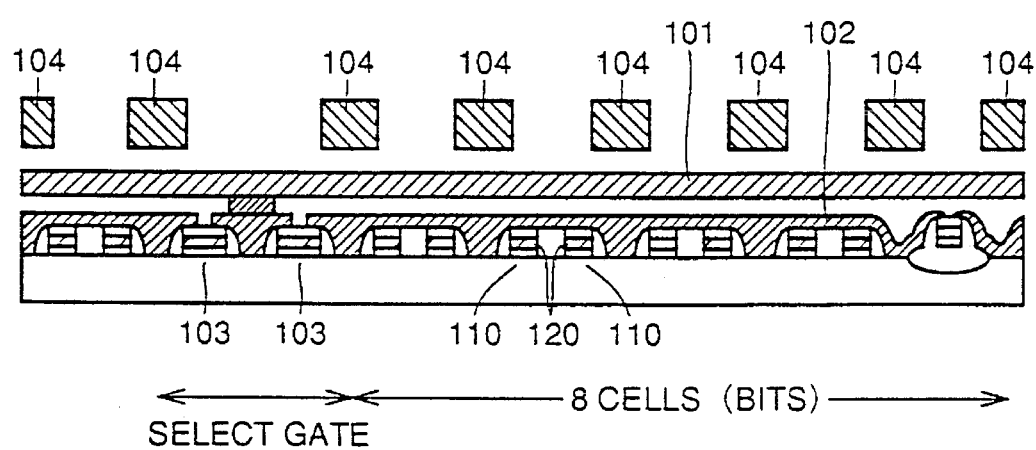
FIG. 9 is a sectional view of a structure of a conventional DINOR type cell.
Figure 10:
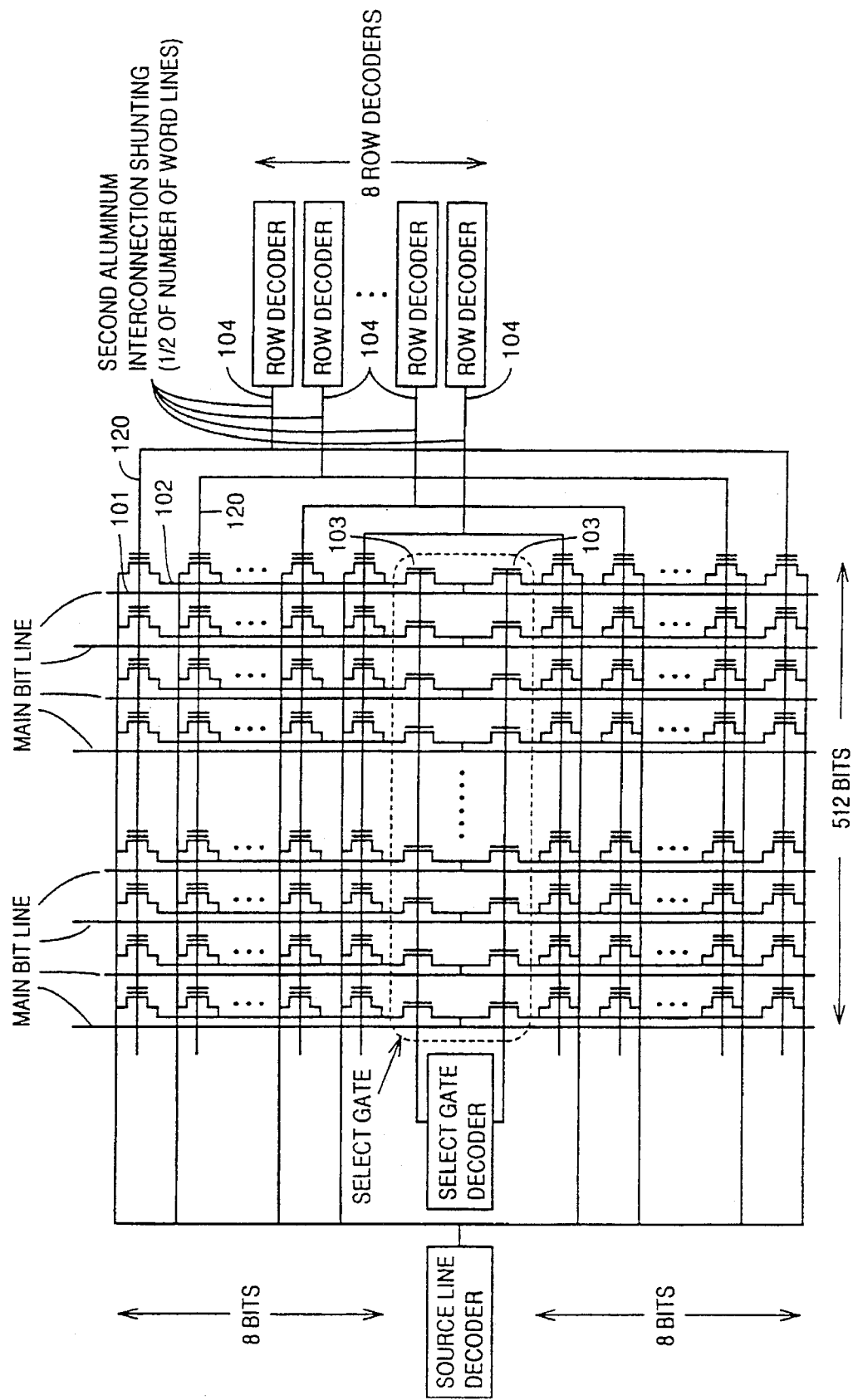
FIG. 10 is an equivalent circuit diagram showing the array structure of the conventional DINOR type cell of FIG. 9.

Although the channel width of select transistors 3a and 3b and the width of the source region are increased in the present embodiment, the memory cell size is reduced sufficiently in comparison with the conventional structure shown in FIG. 9 because the number of memory cells connected to sub-bit line 2 is increased. The present embodiment provides the advantage of reducing the memory cell size while increasing the read out speed and reducing the contact resistance between sub-bit line 2 and the source regions of select transistors 3a and 3b.

According to an aspect of the present invention, a non-volatile semiconductor memory device has the sub-bit line length set corresponding to the length of at least 16 memory cell transistors and not more than 1024 memory cell transistors, so that immunity from drain-disturb is ensured while the effective cell size is reduced. By providing two sub-bit lines with respect to a predetermined length of one main bit line, and connecting one select transistor to each sub-bit line, the pitch of the main bit line can be increased to two times the pitch of a sub-bit line. Therefore, the cell size can further be reduced. Furthermore, by forming a word line of a first conductive layer above the control gate of the memory cell transistor with a first interlayer insulation film therebetween, and a main bit line of a second conductive layer above the word line with a second interlayer insulation film therebetween, word line shunting can be carried out by the first conductive layer that has a minimum pitch smaller than that of the second conductive layer. This eliminates the requirement of a region for connecting word lines (control gates) with each other as in the prior art, so that the effective cell size can further be reduced.

By forming the channel width of the select transistor wider than that of the memory cell transistor, the effective cell size can be reduced while increasing current in a read out operation. By connecting the sub-bit line with the source region of the select transistor via a plurality of contact holes, the effective cell size can be reduced while reducing the contact resistance between the sub-bit line and the source region of the select transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device including a memory cell transistor and a select transistor for storing information by drawing electrons from a floating gate of a memory cell transistor by means of a tunnel phenomenon in a region where a drain region and said floating gate of said memory cell transistor overlap, said nonvolatile semiconductor memory device comprising:

a main bit line electrically connected to said select transistor, and a sub-bit line electrically connected to said memory cell transistor, and having a length corresponding to at least 16 and not more than 1024 memory cell transistors; wherein said sub-bit line comprises two sub-bit lines of a first sub-bit line and a second sub-bit line having a predetermined distance therebetween in a direction perpendicular to the extending direction of said main bit line, said first and second sub-bit lines comprising a plurality of segments spaced apart and extending parallel to the extending direction of said main bit line for a predetermined length of said main bit line L said sub-bit line having one select transistor connected thereto.

2. The nonvolatile semiconductor memory device according to claim 1, wherein a word line of a first conductive layer is formed above a control gate of said memory cell transistor with a first interlayer insulation film therebetween, and said main bit line of a second conductive layer is formed on said word line via a second interlayer insulation film.

3. The nonvolatile semiconductor memory device according to claim 1, wherein the channel width of said select transistor is greater than the channel width of said memory cell transistor.

4. The nonvolatile semiconductor memory device according to claim 1, wherein connection between said sub-bit line and a source region of said select transistor is established via a plurality of contact holes.

5. The nonvolatile semiconductor memory device according to claim 1, wherein said sub-bit line is selected from the group consisting of a polysilicon interconnection, a polycide interconnection, and a refractory metal interconnection.

6. The nonvolatile semiconductor memory device according to claim 1, wherein said sub-bit line is formed in a direction substantially perpendicularly to the extending direction of said word line.

7. A nonvolatile semiconductor memory device including a memory cell transistor and a select transistor for storing information by drawing electrons from a floating gate of a memory cell transistor by means of a tunnel phenomenon in a region where a drain region and said floating gate of said memory cell transistor overlap, said nonvolatile semiconductor memory device comprising:

a main bit line electrically connected to said select transistor, and a sub-bit line electrically connected to said memory cell transistor, and having a length corresponding to at least 16 and not more than 1024 memory cell transistors; wherein said sub-bit line comprises two sub-bit lines of a first sub-bit line and a second sub-bit line having a predetermined distance therebetween in a direction perpendicular to the extending direction of said main bit line, said first and second sub-bit lines comprising a plurality of segments spaced apart and extending parallel to the extending direction of said main bit line for a predetermined length of said main bit line, said sub-bit line having one select transistor connected thereto, wherein said select transistor comprises a first select transistor connected to one end of said first sub-bit line, and a second select transistor connected to one end of said second sub-bit line at the other end side of said first sub-bit line.

8. The nonvolatile semiconductor memory device according to claim 7, wherein the channel width of said first and second select transistors is greater than that of said memory cell transistor.

9. The nonvolatile semiconductor memory device according to claim 7, wherein the channel width of said first and second select transistors is at least 3 times the channel width of said memory cell transistor.

10. The nonvolatile semiconductor memory device according to according to claim 7, wherein the channel width of said first and second select transistors is greater than that of said memory cell transistors, the length of the source region in the channel width direction of said select transistor is substantially equal to the channel width of said select transistor, and connection between said sub-bit line and the source region of said select transistor is established via a plurality of contact holes.

11. A nonvolatile semiconductor memory device including a memory cell transistor and a select transistor for storing information by drawing electrons from a floating gate of a memory cell transistor by means of a tunnel phenomenon in a region where a drain region and said floating gate of said memory cell transistor overlap, said nonvolatile semiconductor memory device comprising:

a main bit line electrically connected to said select transistor, and a sub-bit line electrically connected to said memory cell transistor, and having a length corresponding to at least 16 and not more than 1024 memory cell transistors; wherein connection between said sub-bit line and a source region of said select transistor is established via a plurality of contact holes and the length of the source region in the channel width direction of said select transistor is greater than the channel width of said memory cell transistor.

12. A nonvolatile semiconductor memory device including a memory cell transistor and a select transistor for storing information by drawing electrons from a floating gate of a memory cell transistor by means of a tunnel phenomenon in a region where a drain region and said floating gate of said memory cell transistor overlap, said nonvolatile semiconductor memory device comprising:

a main bit line electrically connected to said select transistor, and a sub-bit line electrically connected to said memory cell transistor, and having a length corresponding to at least 16 and not more than 1024 memory cell transistors; wherein a word line of a first conductive layer is formed above a control gate of said memory cell transistor with a first interlayer insulation film therebetween, and said main bit line of a second conductive layer is formed on said word line via a second interlayer insulation film.

13. A nonvolatile semiconductor memory device including a memory cell transistor and a select transistor for storing information by drawing electrons from a floating gate of a memory cell transistor by means of a tunnel phenomenon in a region where a drain region and said floating gate of said memory cell transistor overlap, said nonvolatile semiconductor memory device comprising:

a main bit line electrically connected to said select transistor, and a sub-bit line electrically connected to said memory cell transistor, and having a length corresponding to at least 16 and not more than 1024 memory cell transistors; wherein said sub-bit line is selected from the group consisting of a polysilicon interconnection, a polycide interconnection, and a refractory metal interconnection.

14. A nonvolatile semiconductor memory device including a memory cell transistor and a select transistor for storing information by drawing electrons from a floating gate of a memory cell transistor by means of a tunnel phenomenon in a region where a drain region and said floating gate of said memory cell transistor overlap, said nonvolatile semiconductor memory device comprising:

a main bit line electrically connected to said select transistor, and a sub-bit line electrically connected to said memory cell transistor, and having a length corresponding to at least 16 and not more than 1024 memory cell transistors; wherein said sub-bit line comprises two sub-bit lines of a first sub-bit line and a second sub-bit line having predetermined distance therebetween in a direction perpendicular to the extending direction of said main bit line, said first and second sub-bit lines comprising a plurality of segments spaced apart and extending parallel to the extending direction of said main bit line for a predetermined length of said main bit line L said sub-bit line having one select transistor connected thereto, wherein the distance between the center line of two consecutive main bit lines is twice the distance between the center line of two consecutive sub-bit lines.

* * * * *